United States Patent [19]
Chen

[11] Patent Number: 5,936,273
[45] Date of Patent: Aug. 10, 1999

[54] HIGH-CAPACITANCE DYNAMIC RANDOM ACCESS MEMORY CELL HAVING A STORAGE CAPACITOR ON A CONTINUOUS IRREGULAR SURFACE

[75] Inventor: Anchor Chen, Pingtung, Taiwan

[73] Assignee: United Microelectronics Corporation, Hsinchu, Taiwan

[21] Appl. No.: 08/899,788

[22] Filed: Jul. 24, 1997

Related U.S. Application Data

[62] Division of application No. 08/616,960, Mar. 15, 1996, Pat. No. 5,736,441.

[51] Int. Cl.⁶ ............................. H01L 29/78; H01L 29/92
[52] U.S. Cl. .................. 257/306; 257/296; 257/298; 257/300; 257/303; 257/309; 257/317; 438/253; 438/254; 438/255; 438/256; 438/397; 438/398; 438/399
[58] Field of Search .................................... 257/296–298, 257/300–303, 306, 309, 317; 438/253–256, 397–399

[56] References Cited

U.S. PATENT DOCUMENTS 3,384,474  5/1968  Park et al. ............................ 257/304
5,292,677  3/1994  Dennison ............................. 257/309
5,386,131  1/1995  Sato .................................... 257/300

*Primary Examiner*—Fetsum Abraham
*Attorney, Agent, or Firm*—Rabin & Champagne, P.C.

[57] ABSTRACT

A semiconductor structure for a DRAM cell having a high capacitance capacitor. The DRAM cell includes a silicon substrate on which a field oxide layer and a transistor having a gate layer and a source/drain region are formed. A contact surface is formed on a surface of the source/drain region. A silicon nitride layer is formed over the gate layer. A thick oxide layer is formed over one part of the silicon nitride layer, at a lateral side of the contact surface. Silicon nitride spacers are formed over opposite lateral sides of the gate layer, the silicon nitride layer, and the thick oxide layer. One of the silicon nitride spacers located adjacent to the contact surface, is shaped in the form of a pointed protrusion. A self-aligned contact insulating layer covers the thick oxide layer and the other silicon nitride spacer, that is located away from the contact surface. This structure defines a jagged surface over at least the contact surface, the pointed protrusion and the silicon nitride layer. A high surface area capacitor structure, including a first conductive layer, a dielectric layer over the first conductive layer, and a second conductive layer over the dielectric layer, is then formed over the jagged surface.

20 Claims, 3 Drawing Sheets

HIGH-CAPACITANCE DYNAMIC RANDOM ACCESS MEMORY CELL HAVING A STORAGE CAPACITOR ON A CONTINUOUS IRREGULAR SURFACE

This is a Division of application Ser. No. 08/616,960. filed Mar. 15, 1996, U.S. Pat. No. 5,736,441.

BACKGROUND OF THE INVENTION

1. Field of the Invention

The invention relates to dynamic random access memory (DRAM) devices, and more particularly, to a method for fabricating a DRAM cell having a high capacitance charge storage capacitor, for reliable data storage thereon.

2. Description of Related Art

The dynamic random access memory (DRAM) is a widely used volatile read-write semiconductor memory device. As shown in FIG. 1, the equivalent circuit of a DRAM cell includes a metal-oxide semiconductor field-effect transistor (MOSFET) 10 having its gate connected to a word line WL and one end of its source/drain region connected to a bit line BL and the other end coupled via a capacitor 12 to ground. The MOSFET 10 is a bi-directional switch in which the source and drain are interchanged in roles for read and write operations.

As is well known to those skilled in the art of semiconductor devices, the capacitor 12 is used to store an amount of electric charge representative of binary data. By principle, the larger the capacitance value of the capacitor 12, the more reliable is the data stored on the capacitor 12.

Previously developed DRAM cells have a drawback that the capacitor has low capacitance. This drawback is depicted in FIG. 2 which shows a schematic cross-sectional view of the structure of a conventional DRAM cell which includes a silicon substrate 20, a field oxide layer 21, a gate oxide layer 22, a first polysilicon layer 23, a gate oxide layer spacer 24, and a source/drain region 25. These elements form the MOSFET part of the DRAM cell. The DRAM cell also includes a SiO$_2$ layer 26 having a contact opening formed above the source/drain region 25. A second polysilicon layer 27 is formed over the contact opening and a dielectric layer 28 based on an NO (nitride/oxide) structure or an ONO (oxide/nitride/oxide) structure is formed over the exposed surface of the second polysilicon layer 27. Further, a third polysilicon layer 29 is formed over the dielectric layer 28. The second polysilicon layer 27, the dielectric layer 28, and the third polysilicon layer 29 constitute the capacitor part of the DRAM cell.

It is a well known principle that the capacitance of a capacitor is proportional to the area of the conducting elements thereof. Accordingly, the capacitance of the capacitor in the DRAM cell is proportional to the area of the second polysilicon layer 27 and the third polysilicon layer 29. As semiconductor technology advances, the feature size of the DRAM cell is continually being reduced for a higher level of integration. A higher level of integration, however, requires a proportional reduction in the area of the conducting elements of the capacitor in the DRAM cell, thus resulting in less capacitance. The reliability of the data stored on the capacitor in the DRAM cell is therefore reduced.

SUMMARY OF THE INVENTION

It is therefore an object of the invention to provide a method for fabricating a DRAM cell which allows the DRAM cell to have a capacitor structure providing a high capacitance, even though the overall feature size of the DRAM cell is reduced.

It is another object of the invention to provide a method for fabricating a DRAM cell which includes procedural steps that are easy to carry out.

In accordance with the foregoing and other objects of the invention, a new and improved DRAM cell structure and method for fabricating the DRAM cell are provided. The method according to the invention comprises the following steps:

(1) First, a field oxide layer and a transistor having a gate layer and a source/drain region are formed on a silicon substrate.

(2) Then, a layer of silicon nitride and an oxide layer are successively formed over the gate layer.

(3) At least one silicon nitride spacer then is formed over each of the lateral sides of the gate layer, the silicon nitride layer, and the thick oxide layer.

(4) Next, an insulating layer is formed over the surface of the structure provided in step (3).

(5) A self-aligned contact mask is used to etch away part of the insulating layer and part of the oxide layer, so as to expose the silicon nitride spacer and a contact surface of the source/drain region and part of the silicon nitride layer. The etched oxide layer forms a thick oxide layer. The silicon nitride spacer is adjacent to the contact surface. The etching process results in this silicon nitride spacer being separated from the thick oxide layer and shaped like a pointed protrusion, thus forming an irregular (jagged) surface defined over at least the spacer, the contact surface and the exposed silicon nitride layer.

(6) A capacitor structure, including a first conductive layer, a dielectric layer over the first conductive layer, and a second conductive layer over the dielectric layer, is then formed over the jagged surface such that the first conductive layer is in contact with the contact surface of the source/drain region.

The DRAM cell according to the invention comprises: (a) a silicon substrate on which a field oxide layer and a transistor having a gate layer and a source/drain region are formed, a contact surface being provided at the surface of the source/drain region; (b) a layer of silicon nitride over the gate layer; (c) a thick layer of oxide over one part of the silicon nitride layer and laterally spaced from lateral sides of the contact surface; (d) silicon nitride spacers formed on lateral sides of the gate layer, the silicon nitride layer, and the thick oxide layer, including a silicon nitride spacer located adjacent to the contact surface and shaped to form a pointed protrusion; (e) a self-aligned contact insulating layer covering the thick oxide layer and another of the silicon nitride spacers that is laterally spaced from the contact surface, thus defining a jagged surface on at least the contact surface, and the silicon nitride layer, and the spacer adjacent to the contact surface; and (f) a capacitor structure formed over the jagged surface, including a first conductive layer, a dielectric layer over the first conductive layer, and a second conductive layer over the dielectric layer, the first conductive layer being connected to the source/drain region through the contact surface.

BRIEF DESCRIPTION OF THE DRAWINGS

The invention can be more fully understood from the subsequent detailed description of the preferred embodiment with reference to the accompanying drawings, wherein.

DETAILED DESCRIPTION OF THE PREFERRED EMBODIMENT

Referring to FIGS. 3A–3E, there are shown schematic sectional views depicting steps involved in the method according to the invention for fabricating a DRAM cell having a high capacitance charge storage capacitor.

Figure 1:
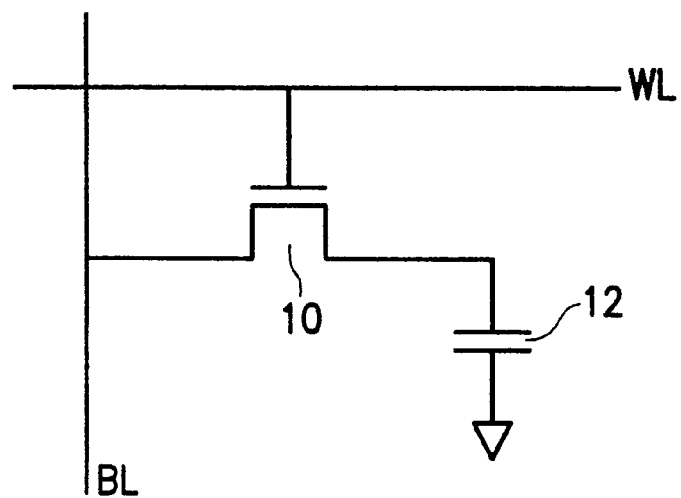
FIG. 1 shows an equivalent circuit of a conventional DRAM cell.
Figure 2:
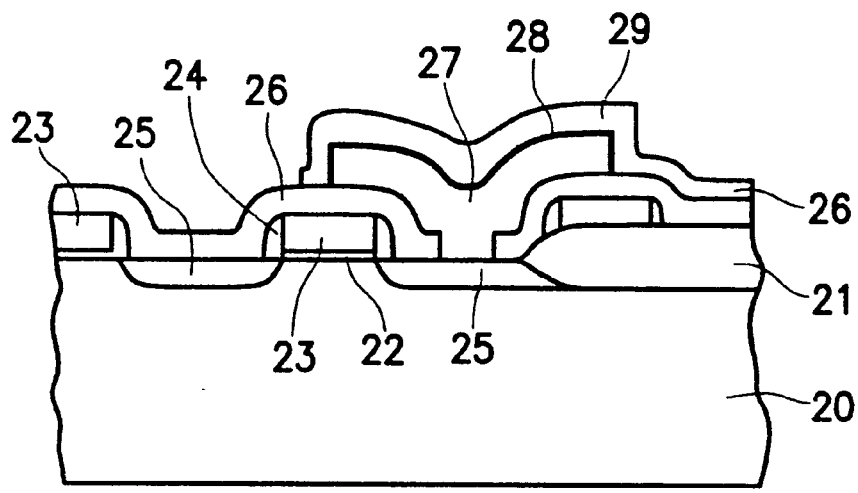
FIG. 2 shows a schematic sectional view of a conventional DRAM cell.
Figure 3A:
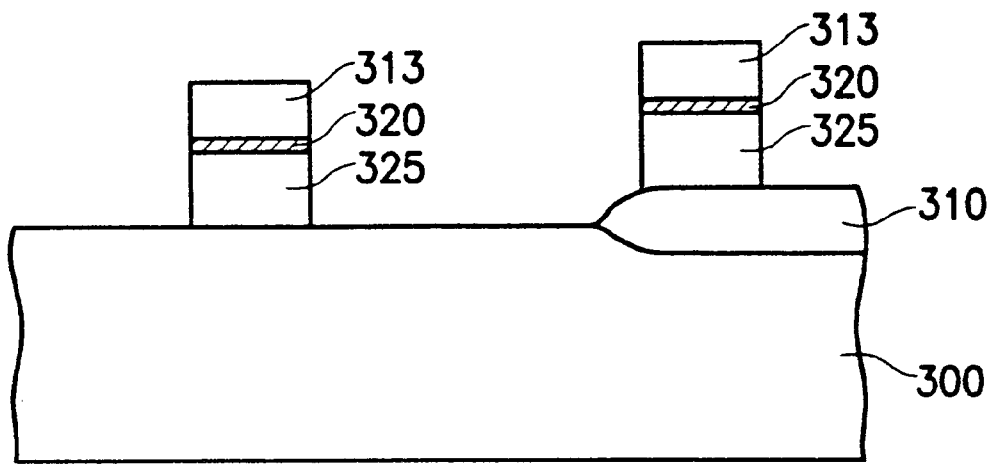
FIGS. 3A–3E are schematic sectional views depicting steps involved in the method according to the invention for fabricating a DRAM cell.

Referring first to FIG. 3A, a silicon substrate 300 is prepared. A conventional local oxidation of silicon (LOCOS) process is then performed, in which a layer of pad oxide and a layer of silicon nitride are deposited successively over the silicon substrate 300. A mask then is used to etch away the exposed part of the silicon nitride layer, allowing the remaining part thereof to serve as an anti-oxidation mask. The resultant structure is then subjected to a thermal oxidation process. Since the oxidation is isotropic, meaning that oxide grows in all directions, the oxide grows underneath the silicon nitride. With continued oxidation, the edge of the silicon nitride mask gradually rises to eventually form a beak-shaped field oxide layer 310. The silicon nitride mask and the pad oxide layer then are removed by etching.

Subsequently, a gate layer 325 and a source/drain region, later to be part of a DRAM cell MOSFET, are formed. The gate layer 325 can be made of polysilicon or polycide, and the source/drain region can be a lightly-doped drain (LDD) structure adapted to prevent short channel effects. The processes for fabricating these elements are conventional techniques well known to the skilled in the art of semiconductor fabrication, so that description thereof will not be further detailed. In the next step, a layer of silicon nitride 320 is formed over the gate layer 325 and a thick layer of oxide 313 is formed over the silicon nitride layer 320.

Alternatively to the above-described steps following the removal of the silicon nitride mask and the pad oxide layer, the thick oxide layer 313, silicon nitride layer 320 and gate layer 325 may be formed by first depositing a gate oxide layer and then depositing successively a polysilicon layer, a silicon nitride layer, and an oxide layer over the wafer. After that, a gate mask is formed. The gate mask is used to (1) etch away part of the oxide layer so as to form the thick oxide layer 313, (2) etch away part of the silicon nitride layer so as to form the silicon nitride layer 320, and (3) etch away part of the polysilicon layer and the gate oxide layer so as to form the gate layer 325. After that, the gate mask is removed.

Figure 3B:
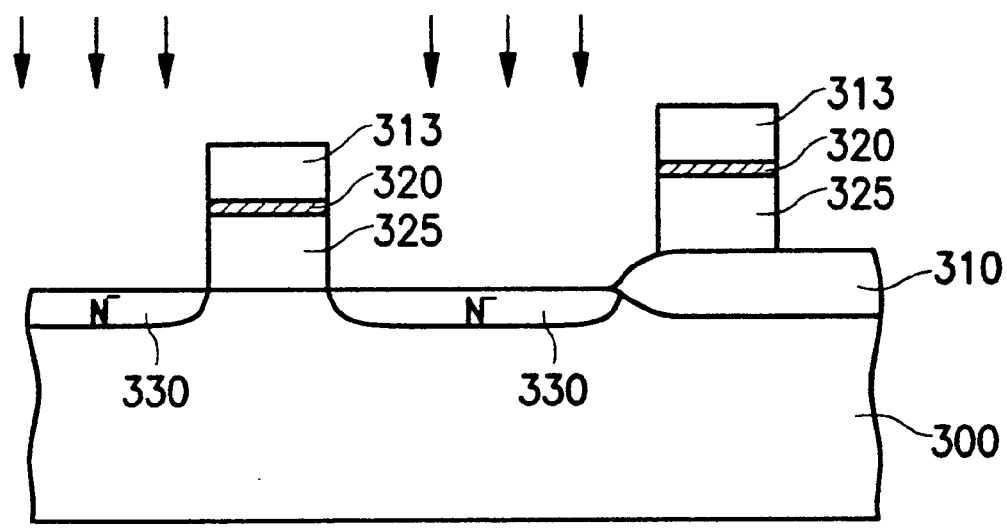

Referring next to FIG. 3B, the purpose of the foregoing step is to prepare to form the source/drain region 330 of the MOSFET in the DRAM cell. Since by present technology the density of the DRAM cells in the IC is very high, the channel in the MOSFET in each DRAM cell can be very short and therefore the source/drain region 330 can be formed with a low concentration of impurities. Using the thick oxide layer 313, the silicon nitride layer 320, and the gate layer 325 as a mask, the source/drain region 330 is doped with a low-concentration source of N-type ions so as to form the source/drain region 330 with a low concentration of N-type impurities.

Figure 3C:
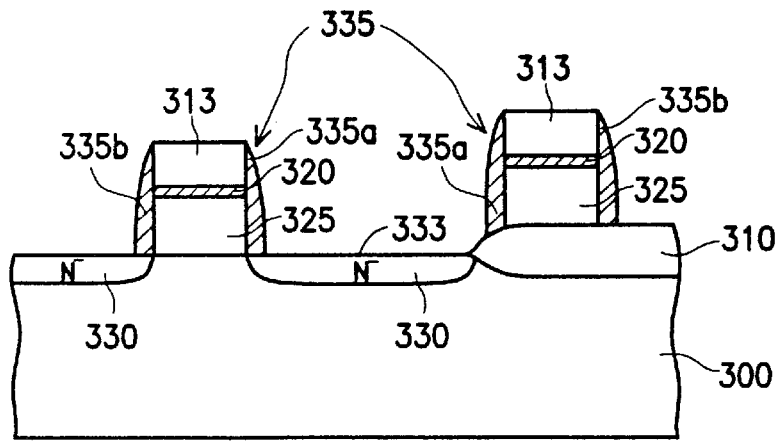

Referring next to FIG. 3C, in a subsequent step a thick layer of silicon nitride is deposited over the wafer (the structure shown in FIG. 3B). Then, the silicon nitride layer is etched back until the source/drain region 330 and the upper surface of the thick oxide layer 313 are exposed, leaving silicon nitride spacers 335 over each of the lateral sides of the gate layer 325, the silicon nitride layer 320, and the thick oxide layer 313. The silicon nitride spacers 335 include spacers 335a adjacent to a contact surface 333 of the source/drain region 330, and spacers 335b laterally spaced therefrom, the contact surface 333 being located adjacent to the field oxide layer 310.

Figure 3D:
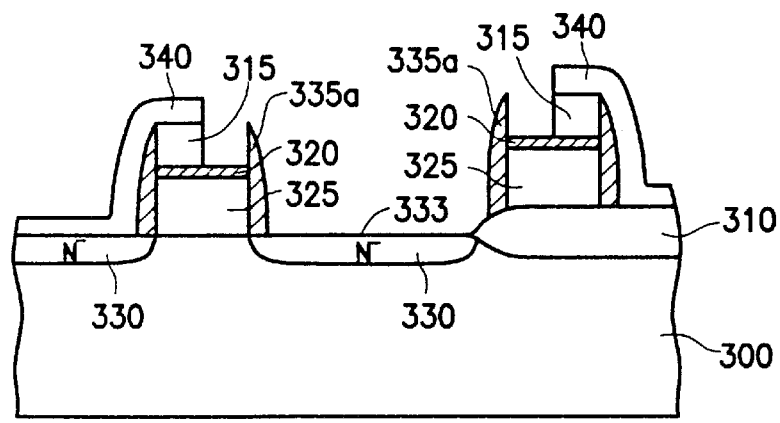

Referring next to FIG. 3D, in a subsequent step, a layer of insulating material such as an oxide is deposited over the wafer (the structure of FIG. 3C). A self-aligned contact mask is then made and used to etch away part of the insulating layer and part of the thick oxide layer 313, so as to expose part of the silicon nitride layer 320, the contact surface 333 of the source/drain region 330, and the silicon nitride spacers 335a. A self-aligned contact insulating layer 340 is thus formed. Also, by etching away a part of the oxide layer 313 a remaining thick oxide layer 315 remains, which defines a mask pattern used to define the self-aligned contact. As illustrated in the figure, the silicon nitride spacers 335a on the inner side adjacent to the contact surface, are separated from the thick oxide layer 315 and shaped to form upwardly pointed protrusions. This creates irregular (jagged) surface over the contact surface 333 and exposed areas of spacers 335a, nitride layer 320, thick oxide layer 315, and insulating layer 340.

Figure 3E:
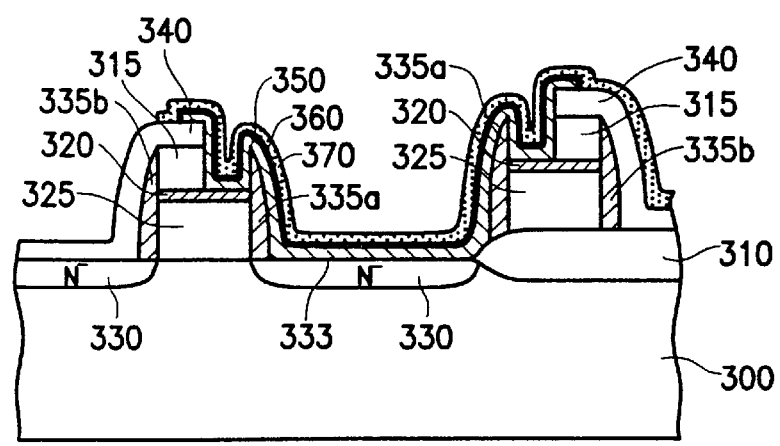

As shown in FIG. 3E, the surface of the source/drain region has the contact surface 333 exposed thereon. In a subsequent step, a capacitor structure is formed over the jagged surface. The capacitor includes a first conductive layer 350, a dielectric layer 360, and a second conductive layer 370. To form the first conductive layer 350, a conductive material such as polysilicon is deposited over the wafer (the structure of FIG. 3D), and then a mask is used to etch away any unwanted part of the conductive layer, leaving the remaining part thereof to serve as the first conductive layer 350. Subsequently, the dielectric layer 360 is formed over the first conductive layer 350. The dielectric layer 360 can, for example, be made of semiconductor materials selected from the group consisting of silicon nitride/silicon dioxide, silicon dioxide/silicon nitride/silicon dioxide, $Ta_2O_5$, and titanite strontium. To form the second conductive layer 370 of the capacitor, a conductive material such as polysilicon is deposited over the wafer and then a mask is used to etch away unwanted parts of the conductive layer, leaving the remaining part thereof to serve as the second conductive layer 370.

In summary, the structure of the DRAM cell fabricated according to the invention includes a silicon substrate 300 on which a field oxide layer 310 and a transistor having a gate layer and a source/drain region 330 are formed. A surface portion of the source/drain region 330 adjacent to the field oxide layer 310 provides a contact surface 333. A layer of silicon nitride 320 is formed over the gate layer 325. A thick layer of oxide 315 is formed over one part of the silicon nitride layer 320 and laterally spaced to one side of the contact surface 333. Silicon nitride spacers 335 are formed on lateral sides of the gate layer 325, the silicon nitride layer 320, and the thick oxide layer 315. Spacers 335 include silicon nitride spacers 335a and 335b. Spacers 335a are located on an inner side, adjacent to the contact surface 333, and is spaced from the thick oxide layer 315, and are shaped to form pointed protrusions. A self-aligned contact insulating layer 340 covers the thick oxide layer and the silicon nitride spacers 335b, that are located on an outer side, spaced from the contact surface 333. This provides a jagged surface.

A capacitor structure is formed over the jagged surface, and includes a first conductive layer 350, a dielectric layer 360 over the first conductive layer 350, and a second conductive layer 370 over the dielectric layer 360 on the contact surface 333, inner spacers 335a, silicon nitride layer 320 and a portion of insulating layer 340 on the thick oxide layer 315. The first conductive layer 350 is connected to the source/drain region 330 through the contact surface 333.

In the preferred embodiment, the gate layer 325 is a polysilicon gate layer and the source/drain region is an N-type region. Further, the first conductive layer and the second conductive layer are polysilicon layers and the dielectric layer is a layer of dielectric material selected from the group consisting of silicon nitride/silicon dioxide, silicon dioxide/silicon nitride/silicon dioxide, $Ta_2O_5$, and titanite strontium.

Since the jagged surface is greater in total surface area than a flat surface of equal horizontal dimension, the capacitor structure formed thereon can be provided with larger areas for the conductive elements, i.e., the first conductive layer 350 and the second conductive layer 370. The capacitance of the capacitor structure in the DRAM cell fabricated by the method according to the invention is therefore greater than that of capacitor structures in conventional DRANM cells of similar dimensions.

The invention has been described above with reference to a preferred embodiment. However, it is to be understood that the scope of the invention is not be limited to the disclosed embodiments. To the contrary, it is intended to cover various modifications and similar arrangements as would be recognized by those skilled in the art. The scope of the invention is limited only by the appended claims, which should be accorded the broadest interpretation so as to encompass all such modifications and similar arrangements.

What is claimed is:

1. A DRAM cell, comprising:
   a silicon substrate;
   a transistor formed on said substrate, said transistor having a gate layer and a source/drain region adjacent the gate layer, the source/drain region having a contact surface;
   a silicon nitride layer disposed over said gate layer;
   a silicon nitride spacer formed against a lateral side of said gate layer adjacent said source/drain region and a lateral side of said silicon nitride layer, said spacer being disposed on one end of said contact surface such that an exposed contact surface remains uncovered by said spacer, wherein the spacer forms an upwardly pointed protrusion that extends beyond an upper surface of the silicon nitride layer, said spacer having a first sidewall facing said contact surface and a second sidewall facing said silicon nitride layer, said second sidewall having an exposed surface above said silicon nitride layer,
   an oxide layer covering a selected portion of said silicon nitride layer, wherein the selected portion is laterally spaced from said spacer such that the selected portion is not directly connected to said spacer, and wherein a portion of the silicon nitride layer that is not covered by the oxide layer is an exposed ton surface of the silicon nitride layer located between the oxide layer and the spacer; and
   an insulating layer covering said oxide layer;
   wherein a continuous irregular surface is defined including said exposed contact surface, the first, the exposed surface of said second sidewall, of said, and the exposed top surface of said silicon nitride layer; and
   the DRAM cell further comprises a capacitor structure, said capacitor structure including a first conductive layer formed on at least the irregular surface, a dielectric layer disposed over said first conductive layer, and a second conductive layer disposed over said dielectric layer, said first conductive layer being connected to said source/drain region through said exposed contact surface.

2. A DRAM cell as claimed in claim 1, further comprising a field oxide layer on said silicon substrate adjacent said source/drain region at a second end of said source/drain region.

3. A DRAM cell as claimed in claim 1, wherein
   said spacer is a first spacer disposed against a first lateral side of said silicon nitride layer and a first lateral side of said gate layer;
   the DRAM cell further comprises a second silicon nitride spacer disposed against a second lateral side of the gate layer, a second lateral side of said silicon nitride layer, and a first lateral side of said oxide layer; and
   said insulating layer is formed over said second silicon nitride spacer.

4. A DRAM cell as claimed in claim 3, wherein the irregular surface further includes a second lateral side of said oxide layer facing said exposed top surface of said silicon nitride layer, a lateral side of said insulating layer facing said exposed top surface of said silicon nitride layer, and an upper surface of said insulating layer.

5. A DRAM cell as claimed in claim 1, wherein said gate layer is a polysilicon gate layer.

6. A DRAM cell as claimed in claim 1, wherein said source/drain region is an N-type region.

7. A DRAM cell as claimed in claim 1, wherein said first conductive layer and said second conductive layer are polysilicon layers.

8. A DRAM cell as claimed in claim 1, wherein said dielectric layer is a layer of silicon nitride/silicon dioxide.

9. A DRAM cell as claimed in claim 1, wherein said dielectric layer is a layer of silicon dioxide/silicon nitride/silicon dioxide.

10. A DRAM cell as claimed in claim 1, wherein said dielectric layer is a layer of $Ta_2O_5$.

11. A DRAM cell as claimed in claim 1, wherein said dielectric layer is a layer of titanite strontium.

12. A DRAM cell, comprising:
    a silicon substrate;
    a transistor formed on the substrate, the transistor having a gate layer and a source/drain region adjacent the gate layer, the source/drain region having a contact surface;
    a silicon nitride layer disposed over the gate layer;
    a silicon nitride spacer formed against a lateral side of the gate layer adjacent said source/drain region and a lateral side of the silicon nitride layer, the spacer extending above the silicon nitride layer and forming an upwardly pointed protrusion adjacent the contact surface and extending beyond an upper surface of the silicon nitride layer thereby defining fully and partially exposed first and second surfaces, respectively;
    an oxide layer disposed to cover a selected portion of the silicon nitride layer, wherein the selected portion is laterally spaced from the spacer such that the selected portion is not directly connected to said spacer, leaving a portion of the nitride layer exposed between the spacer and the oxide layer; and an insulating layer covering the oxide layer;

wherein a continuous irregular surface is defined that includes the exposed contact surface, said exposed first and second exposed surfaces of the spacer and the exposed portion of the silicon nitride layer; and the DRAM cell further comprises a capacitor structure including a first conductive layer formed on at least the irregular surface, a dielectric layer disposed over the first conductive layer, and a second conductive layer disposed over the dielectric layer, the first conductive layer being connected to the source/drain region through the contact surface.

13. A DRAM cell as claimed in claim 12, further comprising a field oxide layer on the silicon substrate adjacent said source/drain region.

14. A DRAM cell as claimed in claim 13, wherein the gate layer is formed on the field oxide layer.

15. A DRAM cell as claimed in claim 14, wherein the spacer is a first spacer disposed against a first lateral side of the silicon nitride layer and a first lateral side of the gate layer;

the DRAM cell further comprises a second silicon nitride spacer disposed against a second lateral side of the gate layer, a second lateral side of the silicon nitride layer, and a first lateral side of the oxide layer;

the insulating layer is formed over the second silicon nitride spacer; and the irregular surface further includes a second lateral side of the oxide layer, and a lateral side and upper surface of the insulating layer.

16. A DRAM cell as claimed in claim 12, wherein the spacer is a first spacer disposed against a first lateral side of the silicon nitride layer and a first lateral side of the gate layer;

the DRAM cell further comprises a second silicon nitride spacer disposed against a second lateral side of the gate layer, a second lateral side of the silicon nitride layer, and a first lateral side of the oxide layer; and the insulating layer is formed over the second silicon nitride spacer.

17. A DRAM cell as claimed in claim 16, wherein the irregular surface further includes a second lateral side of the oxide layer, and a lateral side and upper surface of the insulating layer.

18. A DRAM cell as claimed in claim 12, wherein the gate layer is a polysilicon gate layer.

19. A DRAM cell as claimed in claim 12, wherein the source/drain region is an N-type region.

20. A DRAM cell as claimed in claim 12, wherein the first conductive layer and the second conductive layer are polysilicon layers.

* * * * *